US009424012B1

(12) United States Patent
Frazier et al.

(10) Patent No.: US 9,424,012 B1
(45) Date of Patent: Aug. 23, 2016

(54) PROGRAMMABLE CODE FINGERPRINT

(71) Applicant: INTERNATIONAL BUSINESS MACHINES CORPORATION, Armonk, NY (US)

(72) Inventors: Giles R. Frazier, Austin, TX (US); Michael K. Gschwind, Chappaqua, NY (US); Christian Jacobi, Poughkeepsie, NY (US); Chung-Lung K. Shum, Wappinger Falls, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 14/987,263

(22) Filed: Jan. 4, 2016

(51) Int. Cl.
*G06F 9/45* (2006.01)
(52) U.S. Cl.
CPC ..................................... *G06F 8/443* (2013.01)
(58) Field of Classification Search
CPC G06F 8/443; G06F 11/3466; G06F 2201/865
USPC ................................................... 717/158, 159
See application file for complete search history.

(56) References Cited

U.S. PATENT DOCUMENTS

| 7,882,221 | B2* | 2/2011 | Sailer .................... G06F 21/577 709/223 |
| 9,003,529 | B2 | 4/2015 | Lospinuso et al. |
| 9,111,095 | B2 | 8/2015 | Cohen |
| 2009/0030994 | A1* | 1/2009 | Usher ..................... H04L 51/12 709/206 |
| 2009/0248848 | A1 | 10/2009 | Jeong et al. |
| 2009/0293125 | A1 | 11/2009 | Szor |
| 2012/0084148 | A1 | 4/2012 | Won |
| 2013/0091571 | A1 | 4/2013 | Lu |
| 2013/0212073 | A1* | 8/2013 | Cochrane ................ G09B 7/02 707/687 |
| 2014/0181488 | A1 | 6/2014 | Sama et al. |
| 2015/0186649 | A1 | 7/2015 | Humble et al. |
| 2015/0365437 | A1* | 12/2015 | Bell, Jr. ............... H04L 63/1433 726/1 |

FOREIGN PATENT DOCUMENTS

WO WO2008094725 A1 8/2008

OTHER PUBLICATIONS

Peter Mell et al., "The NIST Definition of Cloud Computing", National Institute of Standards and Technology, U.S. Department of Commerce, NIST Special Publication 800-145, Sep. 2011, 7 pages.
Bao Liu et al., "Fingerprint-Based Detection and Diagnosis of Malicious Programs in Hardware", IEEE Transactions on Reliability, 10 pages, Nov. 17, 2014.
Rajarsha Guha, Functions to Operate on Binary Fingerprint data: "Package Fingerprint", Version3.5.2, Oct. 7, 2013, 26 pages.

* cited by examiner

*Primary Examiner* — Anna Deng
(74) *Attorney, Agent, or Firm* — William A. Kinnaman, Jr., Esq.; Rachel L. Pearlman, Esq.; Heslin Rothenberg Farley & Mesiti P.C.

(57) ABSTRACT

A method, computer program product, and system performing a method that includes a processor compiling a description including information to be utilized by programmable logic to recognize a code fingerprint in a program executing in the runtime environment. The method also includes the processor configuring the programmable logic, by loading the description into the programmable logic at a predefined time and obtaining, during runtime of the program, an alert that the programmable logic recognized the code fingerprint in the program.

18 Claims, 8 Drawing Sheets

PROGRAMMABLE CODE FINGERPRINT

BACKGROUND

A code fingerprint, referred to herein also as a fingerprint, is specific processor behavior that occurs when a given section of code is executing. This processor behavior includes any recognizable behavior such as a particular sequence of branch prediction hits and misses, a particular sequence of data cache hits and misses, a particular sequence of taken and not taken branch instructions, and/or any other behavior or pattern recognizable by hardware. Code fingerprints include, but are not limited to: data cache hit miss sequences for various cache levels, data cache hit miss sequences for a given instruction at a given cache level, sequences of correct/incorrect predictions for either a code segment or for a specific set of branches in a code segment, and a branch taken/not taken history when a given instruction is executed. A code fingerprint may also be a sequence of values, including but not limited to: a sequence of branch target addresses, a sequence of indirect branch target addresses, a sequence of addresses loaded by a load instruction either by a specific instruction or by a sequence of instructions, and/or a sequence of call signatures either for a given function or for all functions.

The number of code fingerprints that a given processor can recognize when code is executed in a computing environment is presently limited because different types of hardware are required to recognize different types of behaviors that comprise different code fingerprints. Thus, a given processor may only recognize a limited number of code fingerprints, which can lead to issues. For example, if recognition of a given fingerprint is not supported in a computing environment, the runtime environment has no way of confirming that a certain sequence is executing. Additionally, a fingerprint recognition apparatus may not have the capability of recognizing a new types of fingerprint that today's rapidly-changing technology may require.

SUMMARY

Shortcomings of the prior art are overcome and additional advantages are provided through the provision of a computer program product for configuring programmable logic to recognize a code fingerprint. The computer program product comprises a storage medium readable by a processing circuit and storing instructions for execution by the processing circuit for performing a method. The method includes, for instance: compiling, by a processor in a runtime environment, a description comprising information to be utilized by programmable logic to recognize a code fingerprint in a program executing in the runtime environment; configuring, by the processor, the programmable logic, by loading the description into the programmable logic at a predefined time; and obtaining, by the processor, during runtime of the program, an alert that the programmable logic recognized the code fingerprint in the program.

Shortcomings of the prior art are overcome and additional advantages are provided through the provision of a method for configuring programmable logic to recognize a code fingerprint. The method includes, for instance: compiling, by the processor in a runtime environment, a description comprising information to be utilized by programmable logic to recognize a code fingerprint in a program executing in the runtime environment; configuring, by the processor, the programmable logic, by loading the description into the programmable logic at a predefined time; and obtaining, by the processor, during runtime of the program, an alert that the programmable logic recognized the code fingerprint in the program.

Shortcomings of the prior art are overcome and additional advantages are provided through the provision of a system to configure programmable logic to recognize a code fingerprint. The system includes a memory, one or more processor in communication with the memory, and program instructions executable by the one or more processor via the memory to perform a method. The method includes, for instance: compiling, by a processor in a runtime environment, a description comprising information to be utilized by programmable logic to recognize a code fingerprint in a program executing in the runtime environment; configuring, by the processor, the programmable logic, by loading the description into the programmable logic at a predefined time; and obtaining, by the processor, during runtime of the program, an alert that the programmable logic recognized the code fingerprint in the program.

Methods and systems relating to one or more aspects are also described and claimed herein. Further, services relating to one or more aspects are also described and may be claimed herein.

Additional features and advantages are realized through the techniques described herein. Other embodiments and aspects are described in detail herein and are considered a part of the claimed aspects. For example, aspects of embodiments of the present invention may also include: compiling, by the processor, a plurality of additional descriptions, wherein each additional description comprises information to be utilized by the programmable logic to recognize at least one additional code fingerprint in the program executing in the runtime environment; obtaining, by the processor, a request from the runtime environment to configure the programmable logic; and based on the obtaining, configuring, by the processor, the programmable logic, by loading at least one of: the description or at least one additional description of the plurality of additional descriptions into the programmable logic, at a predefined time.

Aspects of embodiments of the present invention may also include: generating, by the processor, the description, in a hardware description language.

In and embodiment of the present invention, the description comprises a hardware description and the compiling comprises: utilizing, by the processor, a tool chain to compile the hardware description into a configuration file.

In some embodiments of the present invention, one of a field programmable gate array or a field programmable logic array comprises the programmable logic.

In an embodiment of the present invention, the description comprises at least one of a branch-related input or a memory-related input.

In an embodiment of the present invention, a field programmable gate comprises the programmable logic and the field programmable gate array is communicatively coupled to the processor by an input/output bus.

In an embodiment of the present invention, a chip comprises the programmable logic and the processor.

In an embodiment of the present invention, the alert comprises a lightweight trap.

In an embodiment of the present invention, the predefined time comprises at least one of: a time of initialization or a time specified by the runtime environment.

Aspects of embodiments of the present invention may also include: based on obtaining the alert, compiling, by the processor in a runtime environment, a new description comprising new information to be utilized by the programmable logic to recognize a new code fingerprint in a program executing in the runtime environment; configuring, by the processor, the programmable logic, the configuring comprising: removing the description for the programmable logic; and loading the new description into the programmable logic; and obtaining, by the processor, during runtime of the program, an alert that the programmable logic recognized the new code fingerprint in the program.

In an embodiment of the present invention, removing the description comprises moving the description to a buffer as an historical record.

BRIEF DESCRIPTION OF THE DRAWINGS

One or more aspects are particularly pointed out and distinctly claimed as examples in the claims at the conclusion of the specification. The foregoing and objects, features, and advantages of one or more aspects are apparent from the following detailed description taken in conjunction with the accompanying drawings in which:

DETAILED DESCRIPTION

Figure 1:
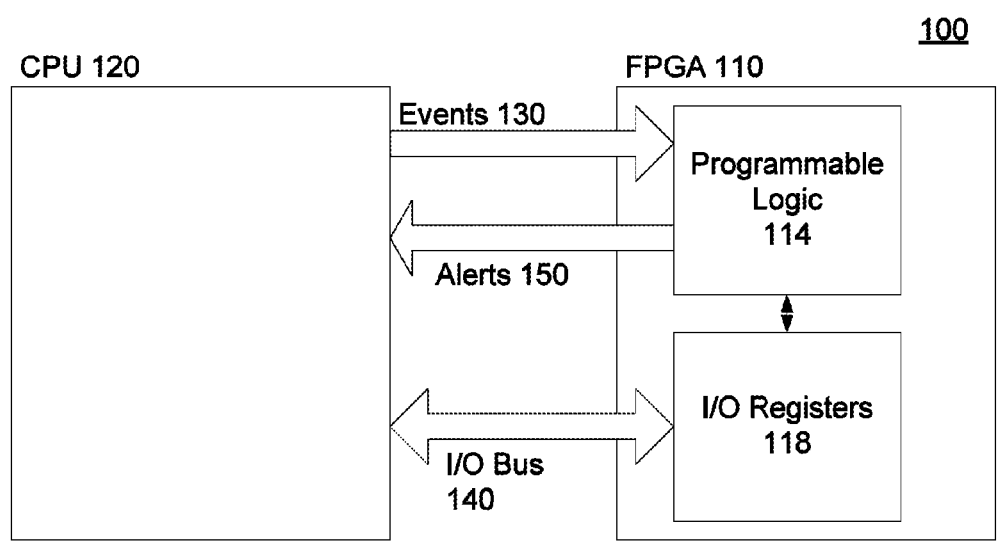
FIG. 1 depicts a computer system that includes aspects of an embodiment of the present invention.

The accompanying figures, in which like reference numerals refer to identical or functionally similar elements throughout the separate views and which are incorporated in and form a part of the specification, further illustrate the present invention and, together with the detailed description of the invention, serve to explain the principles of the present invention. As understood by one of skill in the art, the accompanying figures are provided for ease of understanding and illustrate aspects of certain embodiments of the present invention. The invention is not limited to the embodiments depicted in the figures.

As understood by one of skill in the art, program code, as referred to throughout this application, includes both software and hardware. For example, program code in certain embodiments of the present invention includes fixed function hardware, while other embodiments utilized a software-based implementation of the functionality described. Certain embodiments combine both types of program code.

Figure 6:
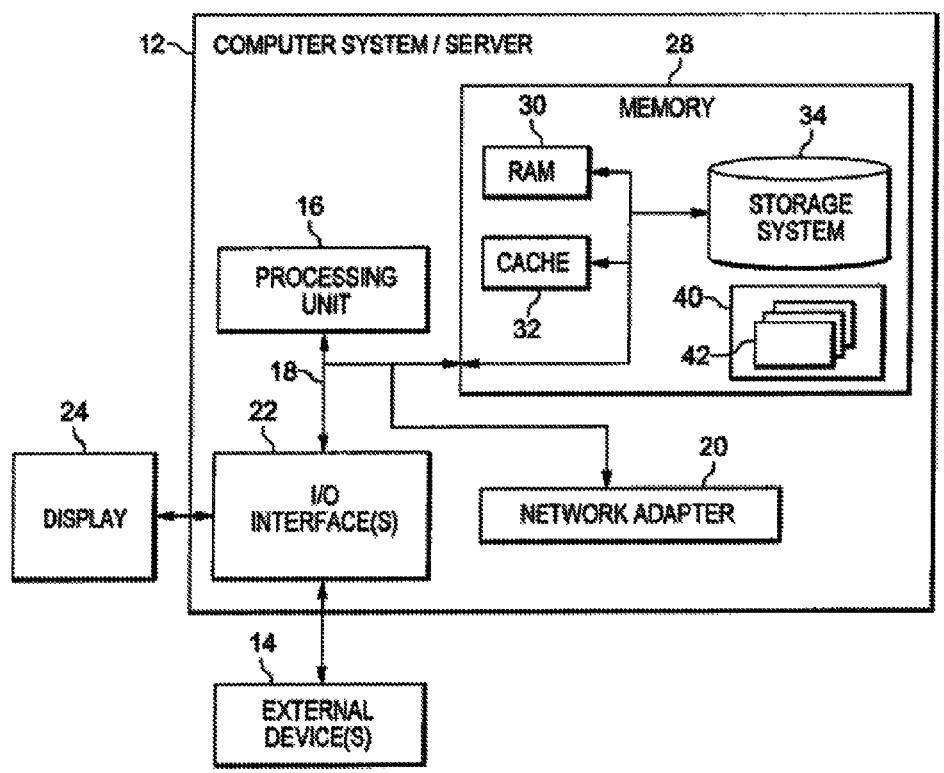
FIG. 6 depicts one embodiment of a cloud computing node.

Embodiments of the present invention include a program code 40 (e.g., FIG. 6) executed by at least one processor 16 (FIG. 6) that programs certain aspects of this embodiment to recognize a previously unknown, also referred to as an arbitrary code fingerprint. In an embodiment of the present invention, the program code 40 is part of a runtime environment of a computer system 12 (FIG. 6). In an embodiment of the present invention, the program code 40 utilizes field-programmable logic to program aspects of the present invention to recognize code fingerprints, including but not limited to, arbitrary code fingerprints.

Aspects of certain embodiments of the present invention provide the advantage of being programmable, both at and after initialization of a computer system, such that a code fingerprint that was previously unknown can be recognized by the program code 40. This functionality represents an improvement to existing computing technology both by increasing the efficiency of a given system and enhancing the accuracy at which the resources of the system, including but not limited to, program code 40 executing in the system can be optimized. This programmable aspect represents an improvement to existing computing technology as presently, in order to recognize a range of different types of fingerprints, a range of different hardware is required in a computing environment. Also, once a system has been initialized, no method exists for adding previously unanticipated code fingerprints to a group of code fingerprints that can be recognized by the existing computer system. The ability to program a computer system to recognize new types of code fingerprints increases the efficiency of the system. For example, without the ability to program new fingerprints, a runtime environment in a computer system may rely on a performance monitor to analyze program behavior, which requires significant additional overhead and does not provide as detailed information. This lack of information can lead the runtime environment to provide only suboptimal optimization. Because aspects of certain embodiments of the present invention enable flexibility in the group of code fingerprints that the program code 40 can identify, the runtime environment can better optimize the computing environment.

Embodiments of the present invention provide program code 40, including but not limited to program code 40 that comprises a runtime environment, with the ability to program a programmable logic device, including but not limited to a hardware or a software device, to recognize a code fingerprint. In an embodiment of the present invention, because the program code 40 can program the device to recognize a code fingerprint, it can program the device to recognize any code fingerprint.

As described above, there are many different types of code fingerprint and with the constant advances in technology, new types of code fingerprints emerge. An advantage of certain aspects of the present invention in that these aspects enable a runtime environment to recognize any specific fingerprint to exactly match its needs, resulting in much a more precise and improved optimization capability.

FIG. 1 illustrates a computer system 100 which includes certain aspects of an embodiment of the present invention. The computer system 100 includes a Field Programmable Gate Array (FPGA) 110. The FPGA 110 is one example of a Field Programmable Logic Array (FPLA) that can be utilized in embodiments of the present invention. In this example, by accessing the FPGA 110 and configuring the programmable logic therein, the program code 40 (FIG. 6) comprising the runtime environment to provide a computer system with an arbitrary fingerprint recognition capability. The FPGA 110 is merely one example of how certain embodiments of the present invention provide program code 40 with programmable logic to configure to recognize code fingerprints. As understood by one of skill in the art, this example is provided merely for illustrative purposes.

The FPGA 110 of FIG. 1 includes programmable logic 114 that program code 40 (FIG. 6) executing on a processor of the CPU 120 configures in order to enable the computer system 100, and specifically, in this example, the FPGA 110, to recognize code fingerprints. In this embodiment of the present invention, the FPGA 110 is external to the CPU 120 and the FPGA 110 and CPU 120 are communicatively coupled by an I/O bus 140.

In the embodiment of FIG. 1, program code 40 configures the programmable logic 114 in the FPGA 110 at initialization. Additionally, the program code 40 (i.e., a processor as the program executes) provides inputs to the FPGA 110, and the FPGA 110 accepts these inputs, at various events 130. The inputs which the program code 40 (i.e., processor) sends the FPGA 110 to represent events 130 may include, but are not limited to, branch-related inputs and memory-related inputs. The branch-related inputs may include, but are not limited to: branch instruction completions, taken branch instruction completions, taken branch instruction addresses, branch instruction hits, branch misses, call instruction completions, and/or call signature value. The memory-related inputs may include, but are not limited to: load instruction completions, load instruction cache hits at each data cache level, and/or load instruction data addresses. These inputs may include, but are not limited to, signals and/or messages. The program 40 routes the inputs into the FPGA 110.

In an embodiment of the present invention, the program code 40 may program the programmable logic 114 using a hardware description language, including but not limited to, In the above diagram, any form of Fingerprint Recognition logic in the FPGA can be programmed using a hardware description language, including but not limited to VHSIC Hardware Description Language (VHDL) and/or Verilog.

In an embodiment of the present invention, to configure the programmable logic 114 in the FPGA 110 at initialization or at a later time, the program code 40 compiles a hardware description in an FPGA configuration file. In order to compile the FPGA configuration file, the program code 40 may utilize an FPGA tool chain. At initialization or at a later time, the program code 40 loads the compiled file into the FPGA 110.

Although the embodiment pictured in FIG. 1 includes an FPGA 110 that is external to a CPU 120, some embodiments of the present invention provide programmable logic 114 on the same chip as a microprocessor of the CPU 120. Although the functionality of these embodiments would be equivalent to the functionality described in the context of the embodiment in FIG. 1, embodiments that provide FPGA-based fingerprint recognition and a microprocessor on the same chip have the speed and packaging advantages of on-chip integration.

Some embodiments of the present invention enable the program code 40 (e.g., FIG. 6) to reprogram the programmable logic in, for example, an FPGA or an FPLA, after initialization. In these embodiments of the present invention, the program code 40 compiles more than one data set that the programmable logic can utilize to recognize fingerprints. These data sets may be, for example, hardware descriptions in FPGA configuration files. The program code 40 would configure the programmable logic with the fingerprint criteria in a given data set upon request from the runtime environment. An advantage of embodiments where the program code 40 can utilize criteria in multiple data sets is that they increase the variety of fingerprints that can be used and enable the runtime environment to couple the fingerprint recognition functionality to the needs of the current program.

As aforementioned, in some embodiments of the present invention, the program code 40 (e.g., FIG. 6) may configure the programmable logic 114 (e.g., FIG. 1), including but not limited to an FPGA 110 (e.g., FIG. 1) and/or an FPLA, to support recognition of any type of fingerprint and/or multiple types of fingerprints. Some non-limiting examples fingerprints that the program code 40 may configure the programmable logic to support include branch-type fingerprints, cache hit/miss-related fingerprints, branch prediction hit/miss fingerprints, and/or histories of a selected data values, such as a histories of call signature values, histories of branch target addresses, and histories of addresses loaded from.

Figure 2:
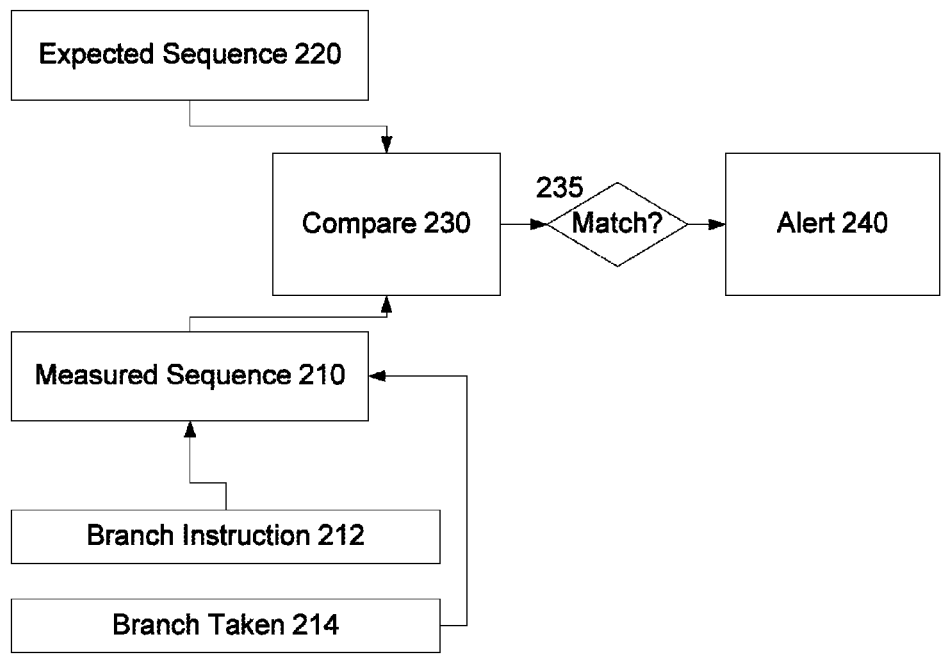
FIG. 2 depicts an example of programmable logic in an embodiment of the present invention.

Although the programmable logic 114 can be configured such that FPGA 110 recognizes of any type of fingerprint and/or multiple types of fingerprints, for ease of understanding, FIG. 2 provides an example of the operation of programmable logic 114 when it is configured by the program code 40 to recognize branch-type fingerprints. As understood by one of skill in the art, similar logic could be programmed to additional types of fingerprints, including but not limited to, cache hit/miss-related fingerprints, and/or branch prediction hit/miss fingerprints.

Referring to FIG. 2, in an embodiment of the present invention, program code 40 (e.g., FIG. 6) configured the programmable logic 214 to recognize a fingerprint that includes a Measured Sequence 210. The program code 40 configured the Measured Sequence 210 with a Branch Instruction 212 and a Branch Taken 214 conditional jump. The program code 40 provides the programmable logic 214 with an Expected Sequence 220, which is a sequence from the program executing in the runtime environment of the computer system. Based on receiving the Expected Sequence 220 from the program code 40, the programmable logic 214 compares the Expected Sequence 220 with the fingerprint that is the Measured Sequence 210. If the sequences match 235, the program code 40 received an alert from the programmable logic.

FIG. 1 also depicts the alert aspect of embodiment of the present invention. In FIG. 1, the programmable logic 114, in an FPGA 110 alerts the CPU 120 that the logic programmed by the program code 40 recognized the programmed fingerprint by sending alerts 150. In an embodiment of the present invention, the programmable logic 114 alerts the runtime environment executing on the CPU 120.

When comparing the sequences, the program code 40 may identify identical sequences in the registers and/or the program code 40 may identify a fuzzy match, which would occur, for example, when a hamming distance between the expected and measured sequences is less than a specified value.

In an embodiment of the present invention, the alert is a trap, including but not limited to, a lightweight trap, such as an EBB.

Figure 3:
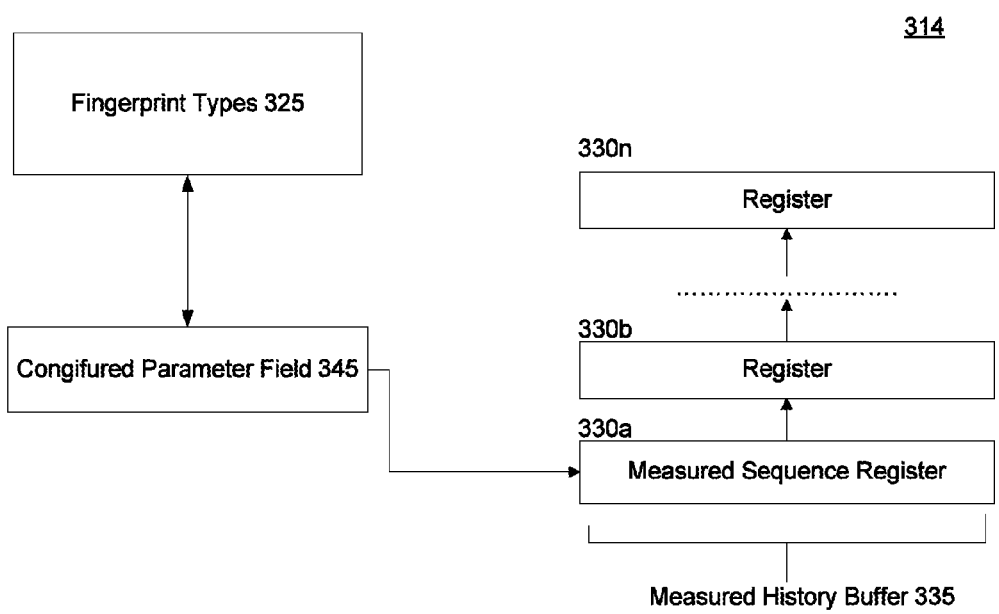
FIG. 3 depicts an example of programmable logic in an embodiment of the present invention.

FIG. 3 depicts an example of the programmable logic 314 that the program code 40 can configure to histories of a selected data values, including, but not limited to, histories of call signature values, histories of branch target addresses, and/or histories of addresses loaded from.

In an embodiment of the present invention, the program code 40 (e.g., FIG. 6) accesses a configuration register to select a type of fingerprint that the programmable logic 314 will recognize. For example, the program code 40 may utilize a Configured Parameter Field 345 in a configuration register to selects the type of fingerprint to be recognized (e.g., load instruction addresses, branch instruction targets, call signatures, etc.). In some embodiments of the present invention, the register is part of an FPGA and accessed over the I/O bus from the CPU. In other embodiments of the present invention, the register is implemented as part of the CPU with its contents accessible from the FPGA.

An advantage of this embodiment of the present invention is that it maintains an historical record of fingerprints configured by the program code 40 in the Configured Parameter Field 345. In the embodiment of FIG. 3, an output register, a Measured Sequence Register 330*a* is part of a Measured History Buffer 330. The Measured History Buffer 330 contains a history of fingerprints configured, shifted to the Measured Sequence Register 330a. When programming logic 314 shifts a new code fingerprint to the Measured Sequence Register 330a, it shifts the content of the Measured Sequence Register 330a, to the first most current historical output register 330b, shifting the content of this register to the second most current historical output register 330c. The programming logic 314 downshifts the content of the remaining registers in the Measured History Buffer 330 accordingly. In an embodiment of the present invention, as each such downshift occurs, the program compares the Measured Sequence History Buffer 330 to an expected history buffer, and if a match between the Measured Sequence History Buffer and an expected sequence history buffer occurs, the processor may alert the program or other actions may be triggered.

In a multi-processor environment, for example, to guarantee that any fingerprint recognized represents a behavior of the processor currently being used and not a mixture of behaviors of another processor, program code 40 can clear the record of fingerprints that are no longer relevant. For example, in an embodiment such as FIG. 3, the program code 40 may clear the Measure Sequence 210 or in an embodiment such as FIG. 4, the program code 40 may clear the Measured History Buffer 330, when a context swap occurs. In an embodiment of the present invention, after each context swap, when the program code 40 clears the fingerprint record, e.g., register, the programming logic may delay recognizing fingerprints for a predefined period of time and/or for a predefined number of instructions to enable transient behavior associated with the context swap to diminish, if needed. In an embodiment of the present invention, the context swap may include the program code 40 re-programming the fingerprint logic (e.g., the FPGA) and/or configuring the logic to recognize a particular expected sequence, unless the same expected sequence is to be recognized for the new program as the old one.

Figure 4:
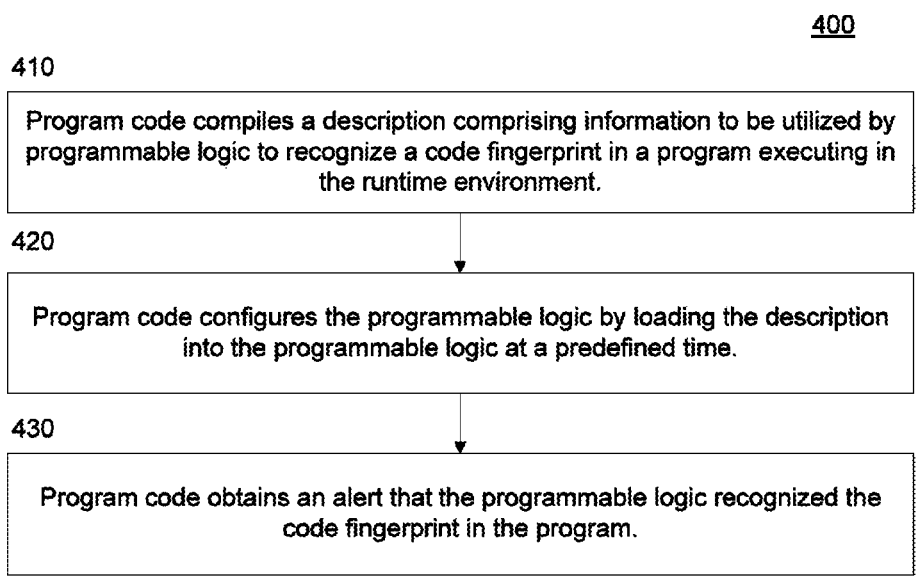
FIG. 4 depicts a workflow incorporating aspects of an embodiment of the present invention.

FIG. 4 depicts a workflow 400 that includes aspects of certain embodiments of the present invention. In an embodiment of the present invention, program code 40 (e.g., FIG. 6) in a runtime environment compiles a description comprising information to be utilized by programmable logic to recognize a code fingerprint in a program executing in the runtime environment (410). In an embodiment of the present invention, the description includes a hardware description and the compiling includes the program code 40 utilizing a tool chain to compile the hardware description into a configuration file. In an embodiment of the present invention, an FGPA or an FPLA comprises the programmable logic. In an embodiment of the present invention, prior to compiling the description, the program code 40 generates the description in a hardware description language.

In an embodiment of the present invention where an FPGA includes the programmable logic, the FPGA is communicatively coupled to a processor executing the program code 40 by an I/O bus. In an embodiment of the present invention, a chip includes the programmable logic and the processor.

The program code 40 configures the programmable logic by loading the description into the programmable logic at a predefined time (420). In various embodiments of the present invention, this predefined time may be at least one of: a time of initialization or a time specified by the runtime environment.

In an embodiment of the present invention, the description comprises at least one of a branch-related input or a memory-related input. During runtime of the program, the program code 40 obtains an alert that the programmable logic recognized the code fingerprint in the program (430). This alert may be a trap, such as a lightweight trap.

In an embodiment of the present invention, the program code 40 compiles a plurality of additional descriptions with each additional description of the plurality including information to be utilized by the programmable logic to recognize at least one additional code fingerprint in the program executing in the runtime environment. The program code 40 obtains a request from the runtime environment to configure the programmable logic. Based on obtaining this request, the program code 40 loads at least one of: the description or at least one additional description of the plurality of additional descriptions, into the programmable logic, at a predefined time.

Figure 5:
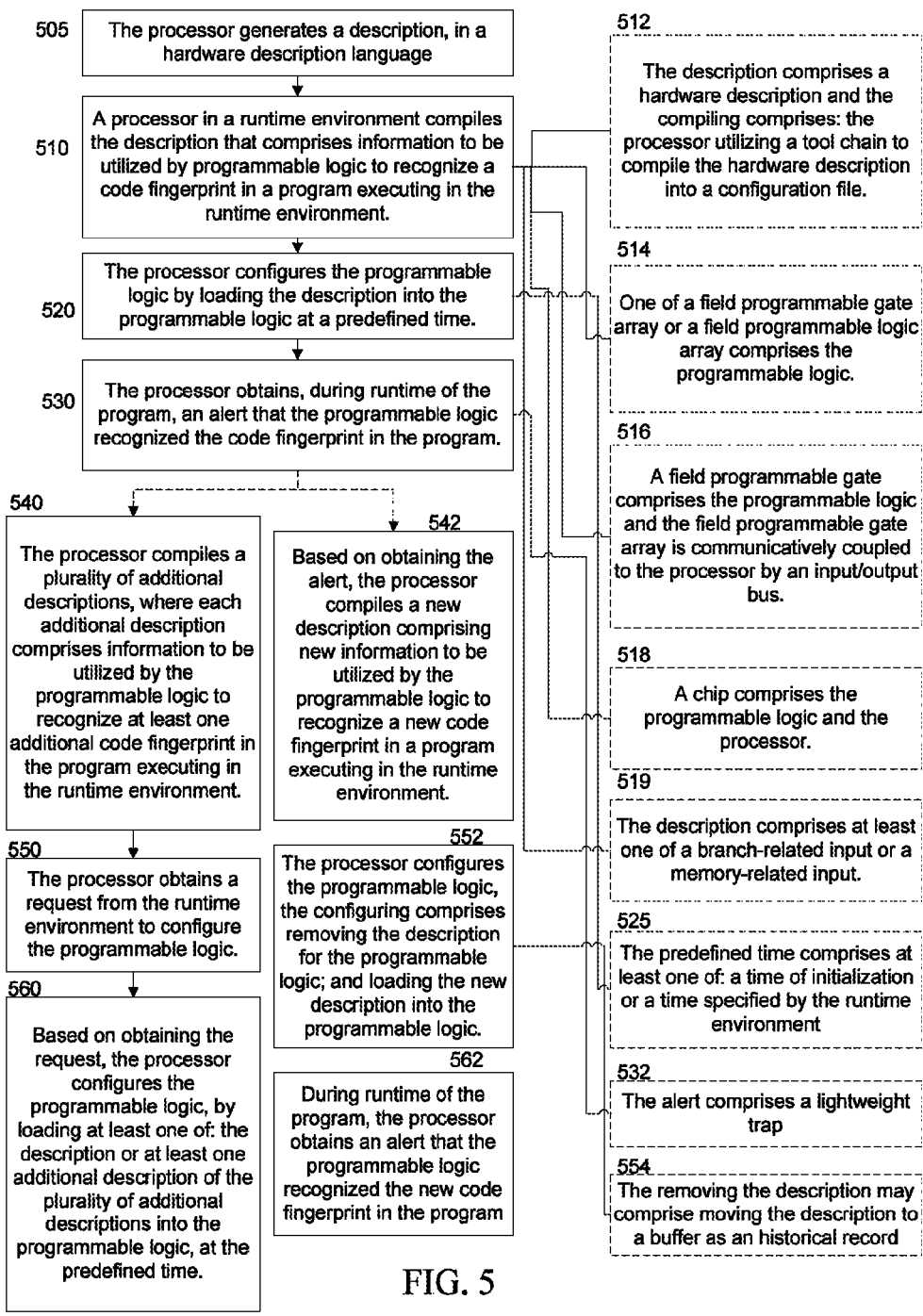
FIG. 5 depicts a workflow incorporating aspects of an embodiment of the present invention.

FIG. 5 is a workflow 500 that illustrates aspects of some embodiments of the present invention. In an embodiment of the present invention, a processor in a runtime environment compiles a description that comprises information to be utilized by programmable logic to recognize a code fingerprint in a program executing in the runtime environment (510). The processor configures the programmable logic by loading the description into the programmable logic at a predefined time (520). The processor obtains, during runtime of the program, an alert that the programmable logic recognized the code fingerprint in the program (530).

In an embodiment of the present where the description comprises a hardware description and the compiling comprises: the processor utilizing a tool chain to compile the hardware description into a configuration file (512).

In an embodiment of the present invention, one of a field programmable gate array or a field programmable logic array comprises the programmable logic (514). In an embodiment of the present invention, a field programmable gate comprises the programmable logic and the field programmable gate array is communicatively coupled to the processor by an input/output bus (516). In an embodiment of the present invention, a chip comprises the programmable logic and the processor (518).

In an embodiment of the present invention, the description comprises at least one of a branch-related input or a memory-related input (519).

In an embodiment of the present invention, the processor generates the description, in a hardware description language (505).

In an embodiment of the present invention, the alert comprises a lightweight trap (532).

In an embodiment of the present invention, the predefined time comprises at least one of: a time of initialization or a time specified by the runtime environment (525).

In an embodiment of the present invention, the processor compiles a plurality of additional descriptions, where each additional description comprises information to be utilized by the programmable logic to recognize at least one additional code fingerprint in the program executing in the runtime environment (540). The processor obtains a request from the runtime environment to configure the programmable logic (550). Based on obtaining the request, the processor configures the programmable logic, by loading at least one of: the description or at least one additional description of the plurality of additional descriptions into the programmable logic, at the predefined time (560).

In an embodiment of the present invention, based on obtaining the alert, the processor compiles a new description comprising new information to be utilized by the programmable logic to recognize a new code fingerprint in a program executing in the runtime environment (542). The processor configures the programmable logic, the configuring comprises removing the description for the programmable logic; and loading the new description into the programmable logic (552). The removing the description may comprise moving the description to a buffer as an historical record (554). During runtime of the program, the processor obtains an alert that the programmable logic recognized the new code fingerprint in the program (562).

One or more aspects may relate to cloud computing.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based email). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load balancing between clouds).

A cloud computing environment is service oriented with a focus on statelessness, low coupling, modularity, and semantic interoperability. At the heart of cloud computing is an infrastructure comprising a network of interconnected nodes.

Referring now to FIG. 6, a schematic of an example of a cloud computing node is shown. Cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 6, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples include, but are not limited to: microcode, device drivers, redundant processing units, external disk drive arrays, RAID systems, tape drives, and data archival storage systems, etc.

Figure 7:
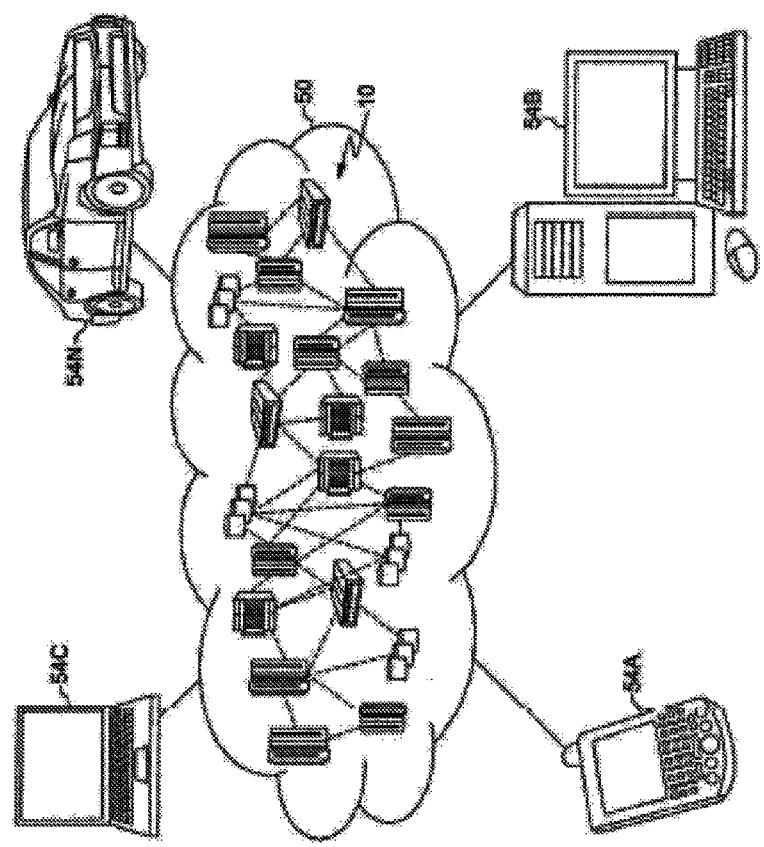
FIG. 7 depicts one embodiment of a cloud computing environment.

Referring now to FIG. 7, an illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 7 are intended to be illustrative only and that computing nodes 10 and cloud computing environment 50 can communicate with any type of computerized device over any type of network and/or network addressable connection (e.g., using a web browser).

Figure 8:
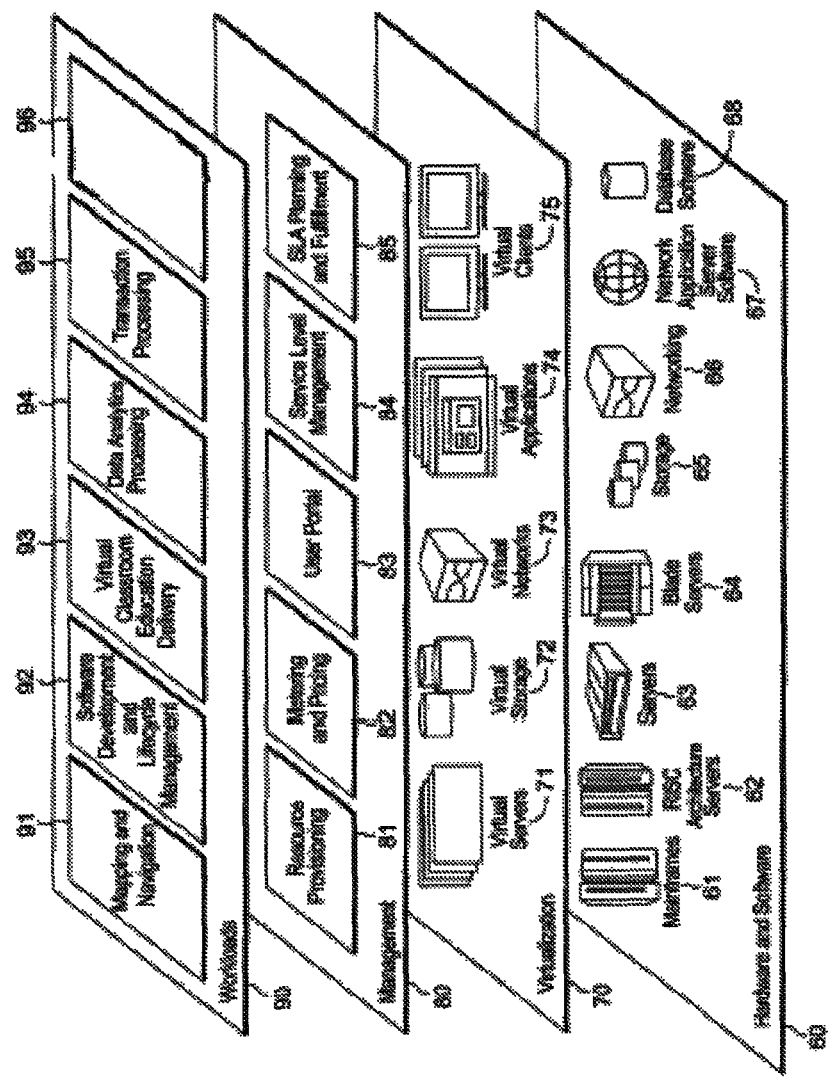
FIG. 8 depicts one example of abstraction model layers.

Referring now to FIG. 8, a set of functional abstraction layers provided by cloud computing environment 50 (FIG. 6) is shown. It should be understood in advance that the components, layers, and functions shown in FIG. 7 are intended to be illustrative only and embodiments of the invention are not limited thereto. As depicted, the following layers and corresponding functions are provided:

Hardware and software layer 60 includes hardware and software components. Examples of hardware components include mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below, which may include maintaining VPD at a VPD location the computer system. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and utilizing field-programmable logic to recognize a code fingerprint.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In addition to the above, one or more aspects may be provided, offered, deployed, managed, serviced, etc. by a service provider who offers management of customer environments. For instance, the service provider can create, maintain, support, etc. computer code and/or a computer infrastructure that performs one or more aspects for one or more customers. In return, the service provider may receive payment from the customer under a subscription and/or fee agreement, as examples. Additionally or alternatively, the service provider may receive payment from the sale of advertising content to one or more third parties.

In one aspect, an application may be deployed for performing one or more embodiments. As one example, the deploying of an application comprises providing computer infrastructure operable to perform one or more embodiments.

As a further aspect, a computing infrastructure may be deployed comprising integrating computer readable code into a computing system, in which the code in combination with the computing system is capable of performing one or more embodiments.

As yet a further aspect, a process for integrating computing infrastructure comprising integrating computer readable code into a computer system may be provided. The computer system comprises a computer readable medium, in which the computer medium comprises one or more embodiments. The code in combination with the computer system is capable of performing one or more embodiments.

Although various embodiments are described above, these are only examples. For example, computing environments of other architectures can be used to incorporate and use one or more embodiments. Further, different instructions, instruction formats, instruction fields and/or instruction values may be used. Many variations are possible.

Further, other types of computing environments can benefit and be used. As an example, a data processing system suitable for storing and/or executing program code is usable that includes at least two processors coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of one or more embodiments has been presented for purposes of illustration and description, but is not intended to be exhaustive or limited to in the form disclosed. Many modifications and variations will be apparent to those of ordinary skill in the art. The embodiment was chosen and described in order to best explain various aspects and the practical application, and to enable others of ordinary skill in the art to understand various embodiments with various modifications as are suited to the particular use contemplated.

What is claimed is:

1. A computer-implemented method, comprising:
compiling, by a processor in a runtime environment, a description comprising information to be utilized by programmable logic to recognize a code fingerprint in a program executing in the runtime environment;
configuring, by the processor, the programmable logic, by loading the description into the programmable logic at a predefined time;
obtaining, by the processor, during runtime of the program, an alert that the programmable logic recognized the code fingerprint in the program;
based on obtaining the alert, compiling, by the processor in a runtime environment, if a new description comprising new information to be utilized by the programmable logic to recognize a new code fingerprint in a program executing in the runtime environment;
configuring, by the processor, the programmable logic, the configuring comprising:
removing the description for the programmable logic; and
loading the new description into the programmable logic; and
obtaining, by the processor, during runtime of the program, an alert that the programmable logic recognized the new code fingerprint in the program.

2. The computer-implemented method of claim 1, wherein the
description comprises a hardware description and the compiling comprises:
utilizing, by the processor, a tool chain to compile the hardware description into a configuration file.

3. The computer-implemented method of claim 1, wherein one of a
field programmable gate array or a field programmable logic array comprises
the programmable logic.

4. The computer-implemented method of claim 1, wherein the
description comprises at least one of a branch-related input or a memory-related input.

5. The computer-implemented method of claim 1, further comprising, generating, by the processor, the description, in a hardware description language.

6. The computer-implemented method of claim 1, wherein a field
programmable gate comprises the programmable logic and the field programmable gate array is communicatively coupled to the processor by an input/output bus.

7. The computer-implemented method of claim 1, wherein a chip comprises the programmable logic and the processor.

8. The computer-implemented method of claim 1, wherein the alert comprises a lightweight trap.

9. The computer-implemented method of claim 1, wherein the predefined time comprises at least one of: a time of initialization or a time specified by the runtime environment.

10. The computer-implemented method of claim 1, further comprising:
compiling, by the processor, a plurality of additional descriptions, wherein each additional description comprises information to be utilized by the programmable logic to recognize at least one additional code fingerprint in the program executing in
the runtime environment;
obtaining, by the processor, a request from the runtime environment to configure the programmable logic; and
based on the obtaining, configuring, by the processor, the programmable logic, by loading at least one of: the description or at least one additional description of the plurality of additional descriptions into the programmable logic, at the predefined time.

11. The computer-implemented method of claim 1, wherein the removing the description comprises moving the description to a buffer as an historical record.

12. A computer program product comprising:
a non-transitory computer readable storage medium readable by one or more processor and storing instructions for execution by the one or more processor for performing a method comprising:
compiling, by the processor in a runtime environment, a description comprising information to be utilized by programmable logic to recognize a code fingerprint in a program executing in the runtime environment;
configuring, by the processor, the programmable logic, by loading the description into the programmable logic at a predefined time;
obtaining, by the processor, during runtime of the program, an alert that the programmable logic recognized the code fingerprint in the program;
based on obtaining the alert, compiling, by the processor in a runtime environment, if a new description comprising new information to be utilized by
the programmable logic to recognize a new code fingerprint in a program executing in the runtime environment;
configuring, by the processor, the programmable logic, the configuring comprising:
removing the description for the programmable logic; and
loading the new description into the programmable logic; and
obtaining, by the processor, during runtime of the program, an alert that the programmable logic recognized the new code fingerprint in the program.

13. The computer program product of claim 12, wherein the
description comprises a hardware description and the compiling comprises:
utilizing, by the processor, a tool chain to compile the hardware description into a configuration file.

14. The computer program product of claim 12, further comprising, generating, by the processor, the description, in a hardware description language.

15. The computer program product of claim 12, wherein a field
programmable gate comprises the programmable logic and the field programmable gate array is communicatively coupled to the processor by an input/output bus, or wherein a chip comprises the programmable logic and the processor.

16. The computer program product of claim 12, further comprising:
compiling, by the processor, a plurality of additional descriptions, wherein each additional description comprises information to be utilized by the programmable logic to recognize at least one additional code fingerprint in the program executing in
the runtime environment;

obtaining, by the processor, a request from the runtime environment to configure the programmable logic; and based on the obtaining, configuring, by the processor, the programmable logic, by loading at least one of: the description or at least one additional description of the plurality of additional descriptions into the programmable logic, at the predefined time.

17. A system comprising:

a memory;

one or more processor in communication with the memory; and program instructions executable by the one or more processor via the memory to perform a method, the method comprising:

compiling, by the processor in a runtime environment, a description comprising information to be utilized by programmable logic to recognize a code fingerprint in a program executing in the runtime environment;

configuring, by the processor, the programmable logic, by loading the description into the programmable logic at a predefined time;

obtaining, by the processor, during runtime of the program, an alert that the programmable logic recognized the code fingerprint in the program;

based on obtaining the alert, compiling, by the processor in a runtime environment, if a new description comprising new information to be utilized by the programmable logic to recognize a new code fingerprint in a program executing in the runtime environment;

configuring, by the processor, the programmable logic, the configuring comprising:

removing the description for the programmable logic; and loading the new description into the programmable logic; and obtaining, by the processor, during runtime of the program, an alert that the programmable logic recognized the new code fingerprint in the program.

18. The system of claim 17, further comprising:

compiling, by the processor, a plurality of additional descriptions, wherein each additional description comprises information to be utilized by the programmable logic to recognize at least one additional code fingerprint in the program executing in the runtime environment;

obtaining, by the processor, a request from the runtime environment to configure the programmable logic; and based on the obtaining, configuring, by the processor, the programmable logic, by loading at least one of: the description or at least one additional description of the plurality of additional descriptions into the programmable logic, at a predefined time.

\* \* \* \* \*